United States Patent [19]
Holzl et al.

[11] Patent Number: 5,286,565
[45] Date of Patent: * Feb. 15, 1994

[54] OXIDATION RESISTANT CARBON AND METHOD FOR MAKING SAME

[75] Inventors: Robert A. Holzl, Flintridge, Calif.; Vincent L. Magnotta, Wescosville, Pa.; Paul N. Dyer, Allentown, Pa.; Howard P. Withers, Jr., Fleetwood, Pa.

[73] Assignee: Air Products and Chemicals, Inc., Allentown, Pa.

[*] Notice: The portion of the term of this patent subsequent to Jun. 15, 2010 has been disclaimed.

[21] Appl. No.: 131,479

[22] Filed: Dec. 3, 1987

Related U.S. Application Data

[63] Continuation-in-part of Ser. No. 873,004, Jun. 11, 1986, which is a continuation-in-part of Ser. No. 654,329, Sep. 24, 1984, abandoned.

[51] Int. Cl.$^5$ .............................................. B32B 9/00
[52] U.S. Cl. ..................................... 428/408; 428/698; 428/699; 428/702; 427/249; 427/279; 501/42; 501/49; 501/90; 501/91; 501/92; 501/96; 501/97; 501/99
[58] Field of Search ................ 427/249, 279; 428/408, 428/698, 699, 702; 501/42, 49, 90, 91, 92, 96, 97, 99

[56] References Cited

U.S. PATENT DOCUMENTS 4,515,860 5/1985 Holzl .................................... 428/408

Primary Examiner—Donald P. Walsh
Assistant Examiner—Chrisman D. Carroll
Attorney, Agent, or Firm—Keith D. Gourley; James C. Simmons; William F. Marsh

[57] ABSTRACT

A coated carbon body having improved resistance to high temperature oxidation and a method for producing the coated carbon body are described. The coated carbon body comprises a carbon body, an intermediate glass forming coating and an outer refractory coating on the intermediate coating. The body has a converted porous layer formed by etching and reacting the body with boron oxide and the resulting converted layer contains interconnecting interstices and boron carbide formed by the reaction of the boron oxide and the carbon body. The method comprises contacting a carbon body with boron oxide at an elevated temperature sufficient to cause the reaction between the carbon body and boron oxide to form a converted porous layer which contains interconnecting interstices in the body and boron carbide and then applying the glass forming coating over the converted layer. Preferably an outer refractory coating is applied over the glass forming coating. The glass forming coating comprises compounds selected from the group consisting of silicon nitride, silicon oxynitride and mixtures thereof. Additionally, both the refractory outer coating and the glass forming coating can contain compounds selected from the group consisting of silicon nitride, silicon oxynitride, and mixtures thereof.

30 Claims, No Drawings

OXIDATION RESISTANT CARBON AND METHOD FOR MAKING SAME

The Government of the United States of America has rights in this invention pursuant to Contract No. F33615-86-5032 awarded by the U.S. Department of the Air Force.

CROSS-REFERENCE TO RELATED APPLICATION

This application is a continuation-in-part of Ser. No. 873,004, filed Jun. 11, 1986 which is in turn a continuation-in-part of Ser. No. 654,329, filed Sep. 24, 1984, now abandoned.

TECHNICAL FIELD

This invention relates generally to carbon bodies having improved resistance to oxidation, and more particularly to a method for the manufacture of carbon bodies having improved oxidation-resistance at both high and intermediate temperatures and to oxidation-resistant carbon bodies produced thereby.

BACKGROUND ART

The desirability of providing carbon bodies having oxidation resistance is well-known. Carbonaceous materials such as monolithic carbon, graphite, and carbon-carbon composites of fibers in carbon have excellent strength-to-weight properties at high temperatures, e.g., 1400° C. and higher, and are generally superior to conventional construction materials such as metals and superalloys at these temperatures. In addition, the mechanical strength of a carbon body increases as the temperature increases, whereas in conventional structural metals, the strength decreases with increased temperature.

The use of carbon bodies in high temperature applications has been limited due to the relatively high reactivity of carbon, principally with oxygen, at temperature above about 400-500° C. which results in erosion of the carbon body due to the reaction between carbon and oxygen, yielding carbon monoxide and carbon dioxide. Accordingly, many attempts have been made to provide oxidation-resistant coatings for carbon bodies in order to permit their use in oxidizing environments and at elevated temperatures.

Major difficulties have been encountered in attempting to provide oxidation-resistant coatings on carbon bodies. One difficulty is the wide variation in the coefficient of expansion of various types of carbon bodies and differences in the coefficient of expansion between the carbon body and the coating material. Depending on the raw materials, the coefficient of expansion of the carbon body may be vastly different from that of the oxidation-resistant coating. The stresses that result from different coefficients of expansion between the coating and the underlying carbon body cause cracking or rupture of the coating, particularly when the part is subjected to thermal cycling, which allows oxygen to penetrate the coating and attach the underlying carbon body with resulting loss of structural integrity.

Surface porosity in the carbon body, which results from articles which are not fully densified, may cause pinholes to form in the coating during the coating process which also may result in the ability of oxygen to penetrate to the carbon surface. It has also been found that mechanical vibration, debris impingement, and the like may cause cracking of brittle protective coatings.

Successful resistance to high temperature oxidation may be achieved by the process disclosed in U.S. Pat. No. 4,515,860 which is incorporated herein by reference. The oxidation-resistant carbon body disclosed in this patent has thermochemically deposited thereon a silicon alloy coating containing one or more alloying elements selected from the group consisting of carbon, oxygen, aluminum, and nitrogen. The amount of silicon in the coating is in excess of the stoichiometric amount and the alloy coating has a noncolumnar grain distribution having substantially equiaxial grains of an average diameter of less than 1 micron. Because of the exceptionally fine grain size and even grain distribution in the coating, any cracks that may occur are extremely fine in width and form a mosaic pattern. The amount of silicon in excess of the stoichiometric amount fills in these fine cracks when the carbon body is heated to above the melting point of silicon, e.g., above 1410° C., and reacts with any oxygen to form a glassy silicon oxide which acts as a filler sealing the cracks. This patent also contemplates, on an optional basis, particularly where lower temperature crack-resistance is desired, providing an intermediate boron layer. Boron reacts with oxygen to form a glassy boron oxide sealant and flows into any cracks that have formed. In commercial practice the carbon body is usually provided with a preliminary treatment in a mixture of chromic acid and sulfuric acid.

The oxidation resistance conferred by the coatings described in U.S. Pat. No. 4,515,860 provides significant superior characteristics as compared to the coatings of the prior art. Under some circumstances, however, particularly where severe temperature cycling occurs, the protection system may be inadequate to properly seal the cracking which occurs in the brittle coating such that the carbon body is subjected to oxidative attack.

DISCLOSURE OF INVENTION

The present invention provides a coated carbon body having improved resistance to oxidation over wide temperature ranges including low temperatures of 500-1000° C. and high temperatures in excess of 1400° C. in addition, this invention provides a method for the manufacture of carbon bodies having improved resistance to oxidation over wide temperature ranges and in environments that involve high temperature thermal cycling.

Still further, the present invention provides ablation and erosion resistance to carbon bodies in high temperature oxidizing and non-oxidizing atmospheres.

Very generally, in accordance with the method of the present invention, a carbon body is heated to an elevated temperature, generally above about 1500° C., sufficient to cause a reaction between the carbon body and a gaseous boron oxide reactant. This reaction causes the surface of the carbon body to become etched and results in the formation of boron carbide which is contained in the converted and etched surface. The resulting etched and converted surface zone is about 2 to 250 microns deep. The converted carbon body is thereafter provided with a glass forming coating at least a portion of which is within the etched and converted surface. The glass forming coating comprises compounds selected from the group consisting of silicon nitride, silicon oxynitride and mixtures thereof.

In a preferred embodiment, the carbon body is provided with an outer refractory coating which may contain silicon in excess of stoichiometry. The refractory outer coating comprises compounds selected from the group consisting of carbides, borides or nitrides of silicon, zirconium, tantalum, hafnium, niobium and titanium, silicon oxynitride, and aluminum boride or nitride or mixtures thereof.

In the preferred embodiment of the present invention, the coated carbon body has an outer refractory coating and an intermediate glass forming coating which reacts with oxygen and other constituents that may be present to form a glass-like material. The carbon body also has an additional protective layer essentially within the original dimensions of the uncoated carbon body which has been converted at least in part to boron carbide ($B_4C$). $B_4C$. in use reacts with any oxygen that succeeds in penetrating the intermediate coating forming $B_2O_3$ which is also glass-like in nature.

It has been discovered that the etching of the surface of the carbon body with gaseous boron oxide provides a highly desirable surface upon which to deposit the selected intermediate coating and also provides a further measure of protection against oxidative attach on the carbon body. The oxygen present in the boron oxide reacts at the processing conditions with carbon to form gaseous carbon monoxide. This results in the formation of interconnected interstices or pores extending into and beneath the surface of the carbon body. The boron reacts with the carbon to form boron carbide in accordance with the formula $2B_2O_3 + 7C \rightarrow B_4C + 6CO$. The surface of the carbon body is not eroded uniformly with the result that interconnected pore-like interstices are formed. The boron oxide reacts with the carbon body to a depth that is determined by the length of contact time. The interstices contribute to the total void volume which occupies up to about 50 percent of the volume of the converted layer. The surface of the carbon body, including the internal surfaces of the interstices, contains boron carbide.

As stated, etching of the carbon body with gaseous boron oxide provides two beneficial results. First, the interconnected interstices act as a reservoir for the intermediate coating thereby increasing the volume of the intermediate coating material available for reaction with oxygen. Second, the gaseous boron oxide etch reacts with carbon in the carbon body to form boron carbide which is contained in the porous surface. Boron carbide reacts with oxygen to form glass-like boron oxide. Thus, any oxygen that penetrates the intermediate coating is consumed by the boron carbide before it is able to attack the carbon body.

In order to achieve the desired porous surface, the boron oxide etchant is preferably in the gaseous state. Liquid or solid boron oxide has been found to be too reactive and the surface of the carbon body becomes completely eroded, as compared to forming interconnecting interstices, when boron oxide other than in gaseous form is used.

The carbon body to which the oxidation-resistant coatings are applied may be any one of a number of suitable structural forms of carbon, depending upon the intended use, and may include monolithic graphite, a composite of carbon fibers dispersed in a carbon matrix which in turn may be fully or partially graphitized, or any other suitable carbon. The carbon body may, for example, be a turbine part, a pump impeller, a spacecraft wing edge, or a component of rocket nozzles and engines. The particular type of structure of the carbon body does not form a part of the present invention.

In accordance with the present invention, the untreated carbon body is placed in a suitable reaction chamber, for example, a chemical vapor deposition reactor such as is well-known in the prior art. The carbon body is heated to a temperature above about 1500° C. and more preferably between about 1600° C. and about 1750° C. Higher temperatures are satisfactory but are not required. The pressure in the reaction chamber is maintained between about 0.1 Torr and about atmospheric pressure. Argon at a temperature of between about ambient and 1750° C. is flowed through the chamber as a carrier gas at flow rate of between about 0 and 100.000 standard cubic centimeters per minute (SCCM) for reactors having up to about 36 inch inside diameter and greater than 100,000 SCCM for larger reactors. The gaseous boron oxide may be obtained by the vaporization of boron oxide or may be obtained by reaction in the gaseous state, e.g., by reaction of boron trichloride and a source of oxygen such as steam or a mixture of hydrogen and carbon dioxide. Increased concentration and increased reaction temperatures create increased depth of etch as does increased reaction time. The boron oxide flow rate is controlled between about 1 and about 7000 SCCM for small reactors and over 7000 SCCM for larger reactors. The reaction time may be controlled between about 30 seconds and about 120 minutes and the depth of the etch is generally between about 2 and about 250 microns. If desired, the reaction can be continued until the carbon body is etched throughout. The etched layer of the carbon body generally has a void volume approaching 50 percent of the volume originally occupied by the carbon body.

The etched carbon body is then provided with a glass forming intermediate coating the purpose of which is to react with any oxygen that may enter a crack or rupture and to form a glass-like sealant preventing the oxygen from reaching the carbon surface. In some instances such as when abrasion or erosion resistance are not required, the intermediate coating may be the only protective coating applied to the carbon body. However, For most environments and best oxidation resistance further outer coatings are applied over the intermediate coating.

The low temperature glass forming intermediate coating comprises a primary glass forming species selected from the group consisting of nitrides and oxynitrides of silicon and mixtures thereof which may be deposited on the etched surface of the carbon body by any convenient means such as chemical vapor deposition or other techniques such as sol-gel impregnation.

The intermediate coating may also contain boron, boron oxide, boron carbide, silicon, silicon alloy, silicon dioxide, germania, borides and oxides of zirconium, aluminum, magnesium, hafnium, titanium, carbides of zirconium, hafnium, titanium, nitrides of zirconium, hafnium, titanium, silicon and mixtures thereof.

Nitrides and oxynitrides of silicon can be incorporated within the intermediate coating using two basic process approaches. The initial approach is to nitride silicon metal, or silicon containing compounds, which were incorporated into the intermediate coating in prior processing steps. The second approach is to incorporate the nitride of silicon by adding the compound directly to the intermediate coating.

In the initial approach, it is preferred to conduct the nitriding, or oxynitriding, after silicon metal has been incorporated within the interlayer in prior processing. A reactive nitriding gas is used to convert the silicon metal or silicon containing compounds, to nitrides or oxynitrides. The following sources of reactive nitrogen will result in nitride formation: $N_2$, $NH_3$, $N_2H_4$ and mixtures thereof. It is preferred to use temperatures above about 1000° C., but below 2000° C. Temperatures between 1350-1500° C. result in substantial nitride formation within 24-48 hours of reaction. When using $N_2$ as the nitriding agent, it is preferred to use a nearly pure $N_2$ atmosphere. When using $NH_3$, concentrations above 10 vol. % $N_2$ are preferred. The addition of small amounts of $H_2$ to the reactive atmosphere have also been found to have a favorable effect by increasing the rate of nitriding. Oxygen can be incorporated into the resulting nitride to form an oxynitride using several convenient means. For example, an oxygen containing compound(s), can be added to the nitriding atmosphere. The following compounds can be used alone or in combination: $O_2$, $H_2O$, $CO/CO_2$. Low concentrations of oxygen in the nitriding atmosphere are preferred. For example, the addition of about 600 ppm (vol) of molecular oxygen to a $N_2$ nitriding atmosphere resulted in a high degree of conversion of the silicon solid phase from nitride to oxynitride.

In the second approach, the silicon nitride material is directly added to the intermediate coating. This may be accomplished by using a type of CVD technology known as chemical vapor infiltration to infiltrate the porous etched layer with silicon nitride or oxynitride: sol-gel technology can also be used. The precursors of the Si—O—N material can be any convenient compounds which result in nitride or oxynitride formation within the intermediate coating layer.

Preferably, the intermediate coating partially fills the interstices left as a result of the boron oxide etch. Thus, the void volume produced by the etching step is partially eliminated and the resulting product is essentially the same in its characteristics as the original carbon body.

Silicon may be deposited on the surface of the etched carbon body at a temperature higher than the melting point of silicon, or the silicon may be deposited at a temperature below its melting point and the coated part may subsequently be raised to above the melting point. In either case the silicon, at temperatures above its melting point, "wicks" into and fills the interstices of the etched surface, creating a fully dense surface.

The silicon may react in part with the boron carbide coating that results from the boron oxide etch according to the formula $2Si + B_4C \rightarrow SiB_4 + SiC$. Where chemical vapor deposition is used to deposit silicon. x-ray diffraction data indicates that simple SiB4 is not actually formed but a similar and more complex compound results, namely $B_4(Si,B,C)H$. This probably results from the fact that during chemical vapor deposition of silicon, a hydrogen containing carrier gas is used.

When a silicon alloy intermediate coating is desired, the silicon may be alloyed with one or more other useful elements such as chromium, aluminum, titanium, zirconium, hafnium, vanadium, niobium, tantalum, tungsten, and molybdenum. These elements may be provided in the interstices along with the silicon by suitable deposition techniques as described above, or may be subsequently introduced via a displacement reaction. The free or combined silicon can be displaced in part by any of the above-named species in accordance with reactions similar to the one for titanium as follows:

$$TiCl_4(g) + 3Si(s) \rightarrow TiSi_2(s) + SiCl_4(g)$$

or $$2TiCl_4(g) + SiC(s) + SiB_4(s) + \tfrac{1}{4}C \rightarrow 2SiCl_4 + TiC + TiB_2 + \tfrac{1}{4}B_4C$$

When a carbon body is subjected to thermal cycling such that it is exposed to high temperatures above the melting point of silicon as well as low temperatures in the neighborhood of the melting point of boron oxide, it may be desirable to utilize both a silicon coating and a boron coating.

The boron coating is applied by chemical vapor deposition with the carbon body heated to a temperature above about 500° C. preferably between about 800° C. and about 1600° C. The pressure is maintained between about 0.1 Torr and about 760 Torr, preferably between about 1 Torr and about 200 Torr. A gaseous mixture of a decomposable boron gas, e.g., boron trihalide, preferably boron trichloride, hydrochloric acid, hydrogen, and argon of the following composition may be flowed over the etched carbon body:

| Gas | Flow Rate, SCCM | % of Total Gas |
| --- | --- | --- |
| $BCl_3$ | 440-1500 | 2.4-14.5 |
| $H_2$ | 200-6000 | 6.6-15.8 |
| HCl | 0-7400 | 0-19.5 |
| Ar | 2000-32000 | 60.7-76.2 |

The gas temperature is maintained between about ambient and 1600° C. and the contact time may be varied between about 30 seconds and about 4 hours. A total gas flow rate of between about 100 and about 100,000 SCCM, preferably between about 2600 and about 47,000 SCCM for a reactor having an internal diameter of less than one foot may be used. This results in a boron intermediate coating having a thickness of between about 0.1 micron and 500 microns.

The outer refractory coating may comprise carbides, borides or nitrides of silicon, zirconium, tantalum, hafnium, niobium, titanium, aluminum boride or nitride or mixtures thereof. Additionally the refractory coating may comprise silicon oxynitride.

Outer refractory coatings of silicon nitride or oxynitride can be formed by several means including chemical vapor deposition (CVD). The following systems have been found to be effective for coating formation: $SiCl_4/NH_3$, $Si(CH_3)_4/NH_3$, $SiH_4/NH_3$. These coatings have been prepared at high rates of deposition (>1 mm/hr) by the following reactions: (a) from $SiCl_4$, $NH_3$, and $H_2$ at temperatures of 1100-1500° C. and Pressures of 5-300 Torr; refer to K. Niihara. *Ceramics Bulletin*, Vol. 63, at page 1160 (1984) and K. Niihara and T. Hirai, *Journal of Material Science*, Vol. 11, at page 604 (1976), (b) from $SiF_4$ and $NH_3$ at ~1450° C. and 2 Torr; refer to F. S. Galasso, R. D. Veltri and W. J. Craft, *Ceramics Bulletin*, Vol. 57, at page 453 (1978) and (c) by the reaction of $Si(CH_3)_4$ with $NH_3$ at temperatures of 1100-1500° C. and 8 Torr; K. F. Lartique, M. Ducarroir and B. Amos, *Proceedings IX International Conference CVD*, at page 561 (1984) and K. F. Lartique and F. Sibieude, *Proceedings IX International Conference CVD*, at page 583 (1984). Both $SiCl_4$ and $SiHCl_3$ react rapidly with $NH_3$ at room temperature, but a high degree of gas phase nucleation can be prevented by operating at lower pressures, by the use of concentric gas feed tubes to minimize mixing between the two reactive components, and by very rapid heating immediately before deposition; refer to W. Hanni and H. E. Hintermann, *Proceedings VIII International Conference CVD*, at page 597 (1981). By these means, coherent films of $Si_3N_4$ can be deposited with no $Si(NH)_2$ or $NH_4Cl$ formation.

Both amorphous $Si_3N_4$ and crystalline $\alpha$-$Si_3N_4$ may be deposited depending on the process conditions. At lower pressures and at temperatures <1300° C., amorphous $Si_3N_4$ is deposited; refer to K. F. Lartique and F. Sibieude, *Proceedings IX International Conference CVD*, at page 583 (1984) and K. Niihara and T. Hirai, *Journal of Material Science*, Vol. 11, at page 604 (1976). At temperatures >1400° C., $\alpha$-$Si_3N_4$ is the preferred phase. However, the oxidation resistance of amorphous CVD $Si_3N_4$ at 1550° C. in air has been shown to be at least three times greater than that of the crystalline form; refer to A. K. Gaind and E. W. Hearn, *Journal Electrochemical Society*, Vol. 125, at page 139 (1978).

Small amounts of oxygen in the system will readily cause the formation of silicon oxynitride of variable stoichiometry, e.g., if oxygen at a level of 10–100 ppm is introduced in a nitrogen diluent stream during the CVD process; refer to V. A. Wells and M. V. Hanson, *Proceedings VII International Conference CVD*, at page 190 (1979). Silicon oxynitride has also been deposited in the reaction of $SiH_4/NH_3/H_2$ by including $CO_2$ or NO at temperatures in the range of 850–1000° C.; refer to M. J. Rand and J. Roberts, *Journal Electrochemical Society*, Vol. 125, at page 139 (1978)A. K. Gaind and E. W. Hearn, *Journal Electrochemical Society*, Vol. 120, at page 446 (1973).

It is generally desirable to provide an outer coating of silicon carbide on top of the intermediate coating. The provisions of such overcoating is described in the prior art including the aforementioned U.S. Pat. No. 4,515,860 and may be produced by CVD.

The following examples, which are given to more specifically illustrate some of the ways the method of the invention may be practiced, are not intended to limit the scope of the appended claims. They exemplify various embodiments of the present invention. In several of the proposed applications of coated carbonaceous materials, these coated components will be exposed to environmental moisture and/or water. Additionally, it has been reported in the literature that coating systems containing boron have a lower performance in oxidation testing if the system is intermittently exposed to atmospheric moisture or water.

An aggressive performance test was developed to evaluate oxidation resistance performance including intermittent immersion in water. The oxidation resistance was tested by heating coated coupons in air in a furnace and cycling the temperature from a baseline of 650° C. to a temperature between 1200° C. and 1375° C. The coupons were weighed hourly and a given percent weight loss was selected as the failure point. Specifically, the coupons were placed in an oxidation furnace followed by ramping to 1375° C.; the test cycle was completed by a repeated cycling of the component between 500° and 1000° C. After 20 hours of oxidation testing, the coated samples are placed and soaked in water for 30 minutes at room temperature. Subsequently, the samples are allowed to air dry for 30 minutes followed by a return to oxidation testing. This testing cycle was continued until samples removed from the furnace had a weight loss $\geq 2$ wt%. The number of oxidation test cycle hours (consumed reaching this weight loss criteria) are defined as the coating lifetime in the examples below.

The carbonaceous material used as a starting material for the examples below was a two-dimensional inhibited carbon-carbon composite substrate obtained from Science Applications International Corporation and designated as ICC-S1. Each individual sample was approximately $\frac{1}{2}\Delta \times \frac{3}{4}'' \times \frac{1}{4}''$ in size.

EXAMPLE 1

A batch of coupons was subjected to boron oxide etching and conversion; a temperature of 1651° C. and a pressure of 23 Torr were used for a total treatment time of 32 minutes. The silicon intermediate coating was subsequently applied by treating the batch of coupons at 1180° C. and 260 Torr for 45 minutes per side. The raw materials used were 924 SCCM silicon tetrachloride, 20,000 SCCM hydrogen and 12,500 SCCM nitrogen. These coupons were further processed by nitriding them in a reactive atmosphere at a temperature of 1400° C. and a pressure of 760 Torr. The nitriding gas, composed of 1% hydrogen in molecular nitrogen, was flowed over the parts for a 24-hour period. The XRD analysis of the treated coupons indicated the formation of $\beta$-silicon nitride as the predominant crystalline form of silicon nitride resulting from the nitriding step. Three sample coupons from this batch were then subjected to the oxidation/water immersion testing described above. The average lifetime of the three samples tested was 27 cycle hours. For comparison, an uncoated sample of this substrate has a lifetime of only several cycle hours.

EXAMPLE 2

An additional batch of coupons was initially processed through the silicon deposition step as described in Example 1. This batch of coupons was subsequently thermally treated at 1450° C., 40 Torr in a flowing stream of argon having a flow rate of approximately 12,000 SCCM for 13 minutes. These parts were subsequently treated in a nitriding atmosphere, using 1% hydrogen in molecular nitrogen as the nitriding gas. The treatment conditions were 1500° C., 760 Torr and a 24-hour period. XRD analysis of the treated parts indicated the formation of a $\alpha$-silicon nitride. These parts were subsequently coated to provide a refractory topcoat of silicon nitride. The coating conditions used for the refractory topcoat were 1200° C., 4 Torr and 60 minutes reaction time per side. Reagents used to form the reactive gases were ammonia (100 SCCM), tetramethylsilane (50 SCCM), hydrogen (3000 SCCM) and nitrogen (4000 SCCM). The applied refractory topcoating had a thickness of approximately 25 microns and a hardness of approximately 2100 HV. Three fully treated coupons were subjected to oxidation/water immersion testing as described above; the average cycle hours to failure for this batch was 60.

EXAMPLE 3

An additional set of carbon-carbon samples was subjected through the 1450° C. thermal treatment described in Example 2. Subsequently, boron glass forming coating was formed in a CVD reactor at a temperature of 1400° C., and a pressure of 150 Torr. Boron trichloride (700 SCCM), hydrogen chloride (700 SCCM), hydrogen (1000 SCCM) and argon (5800 SCCM) were flowed over the parts for a treatment time of 30 minutes per side. The coupons were subsequently provided a refractory topcoat of amorphous silicon nitride as described in Example 2. Subsequently, five samples from the fully coated batch were tested in oxidation/water immersion cycle and had an average lifetime of 60 hours.

EXAMPLE 4

An additional batch of carbon-carbon coupons was processed identically to those described in Example 3 with the exception of the processing conditions for the refractory topcoat step. The refractory topcoat step was carried out under exactly the same conditions as described in Example 3, except that four SCCM of molecular oxygen was added to the reactive gases. XRD analysis of the resulting coating indicated it was amorphous. Additionally, X-ray photoelectron spectroscopy results indicate the refractory topcoating to have an approximate stoichiometry of $Si_{2.7}ON_2$; the stoichiometry was estimated after sputter cleaning of the surface with argon to eliminate surface effects. The average performance of five coupons from this batch was 52 cycle hours to failure.

EXAMPLE 5

A batch of sample coupons was initially processed through the silicon intermediate coating step as described in Example 1. The coupons were then subjected to a nitriding atmosphere of high purity $N_2$ at 1500° C. for 24 hours. After this treatment, XRD analysis did not detect the formation of crystalline $Si_3N_4$. This same batch of coupons was again placed in a nitriding atmosphere. In this process, the high purity $N_2$ was replaced with high purity $N_2$ containing 1% (vol) $H_2$. XRD of the treated coupons clearly indicated the formation of crystalline $\alpha$-$Si_3N_4$. This example clearly demonstrates the dramatic effect of the addition of a small amount of hydrogen has on the nitriding rate.

EXAMPLE 6

A batch of carbon-carbon coupons was processed through the silicon deposition step as described in Example 1. These coupons were then reacted in an atmosphere of 2.53% $NH_3$ in Ar at 1380° C. for a 24 hr. period. The resulting coupons were analyzed by XRD. This XRD analysis indicated the formation of $Si_2N_2O$, silicon oxynitride, during the treatment of 1380° C. A small amount of air, which was the source of oxygen for the oxynitride formation, was added during to the reactive atmosphere during the 1380° C. reaction.

What is claimed is:

1. A coated carbon body having improved resistance to high temperature oxidation comprising:
   a carbon body,
   said body having a converted porous layer formed by etching and reacting said carbon body with boron oxide, said converted layer containing interconnecting interstices and boron carbide formed by the reaction of boron oxide and said carbon body and
   a glass forming coating at least a portion of which is within said converted layer, said coating comprising compounds selected from the group consisting of silicon nitride, silicon oxynitride and mixtures thereof.

2. A coated body in accordance with claim 1 wherein a refractory coating is on the glass forming coating.

3. A coated body in accordance with claim 2 wherein the refractory coating comprises carbides, borides or nitrides of silicon, zirconium, tantalum, hafnium, niobium and titanium, silicon oxynitride, and aluminum boride or nitride or mixtures thereof.

4. A coated body in accordance with claim 3 wherein the converted layer has a depth of between about 3 and about 250 microns.

5. A coated body in accordance with claim 4 wherein the converted layer has a void volume of up to about 50 percent of the volume originally occupied by the carbon layer.

6. A coated body in accordance with claim 1 wherein the glass forming coating partially fills the interstices of said converted layer.

7. A coated carbon body having improved resistance to high temperature oxidation comprising:
   a carbon body,
   said body having converted porous layer formed by etching and reacting said carbon body with boron oxide, said converted layer containing interconnecting interstices and boron carbide formed by the reaction of boron and said carbon body,
   a boron-containing intermediate glass forming coating within said converted layer, said intermediate coating comprising compounds selected from the group consisting of silicon nitride, silicon oxynitride and mixtures thereof, and
   an outer refractory coating on said intermediate coating.

8. A coated body in accordance with claim 7 wherein the refractory coating is silicon nitride.

9. A coated body in accordance with claim 7 wherein the refractory coating is silicon oxynitride.

10. A coated carbon body having improved resistance to high temperature oxidation comprising:
    a carbon body,
    said body having converted porous layer formed by etching and reacting said carbon body with gaseous boron oxide, said converted layer containing interconnecting interstices and boron carbide formed by the reaction of boron and said carbon body,
    a boron and silicon-containing intermediate glass forming coating within said converted layer, said intermediate coating comprising compounds selected from the group consisting of silicon nitride, silicon oxynitride and mixtures thereof, and
    an outer refractory coating on said intermediate coating 11. A coated body in accordance with claim 10 wherein the refractory coating is silicon nitride.

12. A coated body in accordance with claim 10 wherein the refractory coating is silicon oxynitride.

13. A method for the manufacture of a coated carbon body having improved resistance to high temperature oxidation comprising:
    providing a carbon body,
    contacting said carbon body with boron oxide at an elevated temperature sufficient to cause reaction between the carbon body and the boron oxide thereby forming a converted porous layer containing interconnecting interstices in said body, which layer contains boron carbide,
    applying a glass forming coating over said converted layer, said glass forming coating comprising compounds selected from the group consisting of silicon nitride, silicon oxynitride and mixtures thereof.

14. A method in accordance with claim 13 wherein an outer refractory coating is applied over said glass forming coating.

15. A method in accordance with claim 13 wherein the elevated temperature is at least about 1500° C. to cause said converted layer to reach a depth of between about 2 and 250 microns.

16. A method in accordance with claim 13 wherein said converted layer has a void volume of up to about 50 percent of the volume originally occupied by the carbon layer.

17. A method in accordance with claim 13 wherein the glass forming coating comprises a primary glass forming species selected from boron, boron carbide, boron oxide, silicon, silicon alloys, silicon dioxide, germania, and mixtures thereof.

18. A method in accordance with claim 13 wherein said glass forming coating also contains borides and oxides of zirconium, aluminum, magnesium, hafnium, titanium, carbides of zirconium, hafnium, titanium, nitrides of zirconium, hafnium, titanium, silicon and mixtures thereof.

19. A method in accordance with claim 13 wherein the glass forming coating is applied by chemical vapor deposition.

20. A method in accordance with claim 14 wherein the outer refractory coating is applied by chemical vapor deposition.

21. A method in accordance with claim 14 wherein the outer refractory coating comprises carbides, borides or nitrides of silicon, zirconium, tantalum, hafnium, niobium, titanium, aluminum boride or nitride or mixtures thereof.

22. A method in accordance with claim 14 wherein the refractory coating is silicon nitride.

23. A method in accordance with claim 14 wherein the refractory coating is silicon oxynitride.

24. A method in accordance with claim 13 wherein the glass forming coating is applied by sol-gel technology.

25. A method for the manufacture of a coated carbon body having improved resistance to high temperature oxidation comprising:
providing a carbon body,
contacting said carbon body with gaseous boron oxide at an elevated temperature sufficient to cause reaction between the carbon body and the boron oxide thereby forming a converted porous layer containing interconnecting interstices in said body, which layer contains boron carbide,
applying an intermediate glass forming coating over said converted layer, said intermediate coating comprising silicon or a silicon-containing compound,
subjecting said body with a nitriding atmosphere to convert said silicon or silicon-containing compound to silicon nitride, and
applying an outer refractory coating over said intermediate coating.

26. A method in accordance with claim 25 wherein the nitriding atmosphere is selected from the group consisting of $N_2$, $NH_3$, $N_2H_4$, and mixtures thereof.

27. A method in accordance with claim 26 wherein said carbon body is subjected to the nitriding atmosphere at temperatures in the range of about 1350° to about 1500° C.

28. A method in accordance with claim 27 wherein the nitriding atmosphere contains small amounts of hydrogen.

29. A method in accordance with claim 25 wherein the nitriding atmosphere contains oxygen or an oxygen-containing compound to convert the silicon or silicon-containing compound to an oxynitride of silicon.

30. A method in accordance with claim 29 wherein the oxygen-containing compound is $H_2O$ or $CO/CO_2$.

* * * * *